US006696710B2

(12) United States Patent
Moll et al.

(10) Patent No.: US 6,696,710 B2
(45) Date of Patent: Feb. 24, 2004

(54) HETEROJUNCTION BIPOLAR TRANSISTOR (HBT) HAVING AN IMPROVED EMITTER-BASE JUNCTION

(75) Inventors: Nicolas J. Moll, Woodside, CA (US); Yu-Min Houng, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 41 days.

(21) Appl. No.: 09/796,180

(22) Filed: Feb. 27, 2001

(65) Prior Publication Data

US 2002/0117657 A1 Aug. 29, 2002

(51) Int. Cl.$^7$ .................. H01L 31/0328; H01L 31/0336; H01L 31/072; H01L 31/109

(52) U.S. Cl. ..................................................... 257/190

(58) Field of Search ................................ 257/190, 197, 257/198, 200, 312, 199, 12, 13, 15, 25, 28, 29

(56) References Cited

U.S. PATENT DOCUMENTS

| 4,821,082 A | | 4/1989 | Frank et al. ................ 357/34 |
| 5,349,201 A | | 9/1994 | Stanchina et al. ........... 257/18 |
| 5,365,077 A | * | 11/1994 | Metzger et al. .............. 257/15 |
| 5,912,481 A | * | 6/1999 | El-Sharawy et al. ........ 257/198 |
| 6,337,494 B1 | * | 1/2002 | Ryum et al. ................. 257/197 |

FOREIGN PATENT DOCUMENTS

| EP | 0 571 944 | | 5/1993 | ........... H01L/29/73 |
| JP | 05226358 A | * | 9/1993 | |
| WO | WO 00/79600 | | 12/2000 | |

OTHER PUBLICATIONS

Ben G. Streetman and Sanjay Banerjee, Solid State Electronic Devices 2000, Prentice Hall, Inc., 5$^{th}$ edition, pp 20–21.*

Driad, R. et al. Effect of Emitter Design on the dc Characteristics of InP–Based Double–Heterojunction Bipolar Transistors, Semiconductor Science and Technology, 16(2001) pp. 171–175.

Hu, J. et al. "A New Emitter Design of InGaP/GaAs HBT's for High–Frequency Applications", IEEE Electron Device Letters, 14 (1993) Dec., No. 12, New York, pp. 563–565.

Fathimulla, A. et al. Performance of the AlGaAsSb/GaInAs GaInAs PNP and AlInAs/GaAsSb/AlInAs NPN HBT's, Device Research Conference, 1994,, pp. 99–100.

Hafizi, M. et al. "Reliability of Hogh–Performance AlInAs/GaInAs Heterojunction Bipolar Transistors under Forward Bias and Temperature Stress" Electron Devices Meeting, Dec. 1992, pp. 71–74.

Driad, R. et al. "InAlAs/InP/InGaAs/InP DHBTS with a Novel Composite–Emitter Design", 11$^{th}$ International Conference on Indium Phosphide and Related Materials, May 16, 1999, pp. 435–437.

Matine, N. et al. "Nearly Ideal InP/GaAsSb/InP Double Heterojunction Bipolar Transistors with Ballistically Launched Collector Electrons", Electronics Letters, Vol 34, No. 17, Aug. 20, 1998, pp. 1.

Bolognesi, C. R. et al. "Low–Offset NpNInP–GaAsSb–Inp Double Heterojunction Bipolar Transistors with Abrupt Interfaces and Ballistically Launched Collector Electrons", Device Research Conference Digest, 1998, pp. 30–31.

* cited by examiner

Primary Examiner—Wael Fahmy
Assistant Examiner—Dana Farahani

(57) ABSTRACT

A heterojunction bipolar transistor (HBT) having a base-emitter junction that exhibits the desirable properties of a GaAsSb/AlInAs interface, but which includes an intermediate layer in the emitter such that the intermediate layer contacts the GaAsSb base and the AlInAs emitter. The intermediate layer is sufficiently thin to be substantially electrically transparent, but sufficiently thick to provide a surface over which to grow the AlInAs emitter. The intermediate layer may be of a material such as InP, which has a bulk lattice constant that matches the lattice constant of the GaAsSb base and the AlInAs emitter. Alternatively, the intermediate layer may be of a material having a lattice constant different than that of the GaAsSb base and the AlInAs emitter, but may be pseudomorphically grown so as to provide an apparent lattice-match to the GaAsSb base and the AlInAs emitter.

24 Claims, 7 Drawing Sheets

HETEROJUNCTION BIPOLAR TRANSISTOR (HBT) HAVING AN IMPROVED EMITTER-BASE JUNCTION

TECHNICAL FIELD

The present invention relates generally to transistors, and, more particularly, to a heterojunction bipolar transistor (HBT) having an improved emitter-base junction.

BACKGROUND OF THE INVENTION

Heterojunction bipolar transistors (HBTs) have become state of the art, particularly in npn form, for applications in which high switching speeds and high frequency operation are desired. The emitter in an HBT has a bandgap wider than the bandgap of the base, thus creating an energy barrier in the valence band at the emitter-base junction that inhibits the unwanted flow of holes from the base region to the emitter region. This arrangement increases the emitter injection efficiency, current gain and operating frequency of the HBT.

First generation commercial HBTs were based on a gallium-arsenide (GaAs) substrate and semiconductor materials lattice matched to GaAs. Next generation HBTs are likely to be based on an indium-phosphide (InP) substrate and semiconductor materials lattice matched to InP. Typically, the base of such an HBT is fabricated from either the indium-gallium-arsenide (InGaAs) material system or the gallium-arsenide-antimonide (GaAsSb) material system, with the collector and the emitter fabricated from, for example, InP, aluminum-indium-arsenide (AlInAs) or InGaAs. HBTs that are fabricated using GaAsSb as the base material and AlInAs as the emitter material offer certain advantages over HBTs in which the base material is GaAsSb and the emitter is material is InP. For example, the conduction band energy line-up between AlInAs and GaAsSb (emitter-base) provides certain advantages, such as higher current-density operation, and hence higher frequency operation. Unfortunately, it is difficult to grow a good AlInAs/GaAsSb interface.

FIG. 1 is a graphical illustration showing an energy band diagram 11 of a conventional InP emitter/GaAsSb base/InP collector HBT under modest forward electrical bias on the emitter-base junction. The vertical axis 12 represents the energy level and the horizontal axis 14 represents distance. That is, the thickness of the material that respectively comprises the emitter region 22, the base region 24 and the collector region 26. A heterojunction bipolar transistor (HBT) with a GaAsSb base and InP collector has a type-II band lineup at the collector-base junction 32 as shown. The energy discontinuity $\Delta E_c$ in the conduction band 16 is about 0.18 electron Volts (eV) and the energy discontinuity $\Delta E_v$ in the valence band 18 is about 0.76 eV. This is an essentially ideal band lineup for this junction for the following reasons. A small ballistic energy $\Delta E_c$ is imparted to collected electrons and there is a large valence-band discontinuity $\Delta E_v$ at the metallurgical base (base-collector junction 32) that minimizes hole injection into the collector region 26 even at low or positive collector bias. Since the wide-bandgap InP extends throughout the collector region 26, avalanche breakdown is minimized.

Other variations of HBTs lattice-matched to InP, but with a base layer different from GaAsSb fail to offer these advantages. For example, the use of the same structure but with an InGaAs base has the large valence-band discontinuity $\Delta E_v$ at the metallurgical base and the benefit of the wide-bandgap InP, but presents a barrier to electron collection, which could result in undesirable stored charge in the base. This compromises the frequency response and maximum current of the device. Any scheme to eliminate this barrier compromises the desired features of the large valence-band discontinuity $\Delta E_v$ at the metallurgical collector-base junction, and the benefit of the wide-bandgap InP.

Furthermore, in HBTs having a GaAsSb base and InP emitter (as shown in FIG. 1) the type II band lineup leads to two undesirable features. Both are related to the discontinuity in the electron concentration across the heterojunction of $\exp(-q\Delta E_c/kT)$, where q is the electron charge, $\Delta E_c$ is the conduction band discontinuity, k is Boltzmann's constant, and T is the absolute junction temperature. Since $\Delta E_C$ is approximately 0.18±0.1 eV, the ratio of electron concentration across the discontinuity is in the range of $2\times10^{-5}$ to $5\times10^{-2}$ at room temperature.

The first undesirable feature is lowered current gain. Below some limiting injection level, it can be shown that interface recombination at the metallurgical junction (the emitter-base junction 28) depends on the electron concentration on the emitter side of the junction and on the interface trap properties.

The interface current density $j_{interface}=qn_{emitter}v_{interface}$, where $n_{emitter}$ is the electron density on the emitter side of the interface and where $v_{interface}$ is the interface recombination velocity. The interface recombination velocity $v_{interface}=\sigma_n v_{thermal} N_{traps}+K_{s\_i\_rad}p_{base}$, where $\sigma_n$ is the cross-section for capture of an electron by an interface trap, $v_{thermal}$ is the thermal velocity of electrons, $N_{traps}$ is the trap concentration as a density per unit area, $K_{s\_i\_rad}$ is a constant that describes the proportionality of spatially indirect radiative recombination at the interface, and $p_{base}$ is the hole concentration on the base side of the interface. The total interface recombination velocity is thus due to recombination through traps, and through spatially indirect radiative recombination. The material interface, as it can be practically grown, will not be electrically perfect. For example, there may be impurities or imperfections at the interface that lead to spatially localized states inside the energy gap. Electrons or holes that land in these spatially localized states cannot move around (unlike electrons or holes in the conduction or valence bands), and these spatially localized states have a potential energy between that of the valence and conduction bands. These spatially localized states can alternately trap electrons and holes, thereby providing a path for recombination. This is conceptually similar to Schockley-Read-Hall recombination. Spatially indirect recombination is band-to-band recombination between electrons that are localized on one side of a type-II heterojunction (in this example the InP side) and holes that are localized on the other side (in this example the GaAsSb side). The recombination is referred to as spatially indirect because the electrons and holes are separated according to classical physics. According to quantum physics the electrons and holes are not perfectly localized. They are represented by wave functions that slightly overlap. Therefore, some recombination occurs. Both of these effects are known to those having ordinary skill in the art.

The injection current density $j_{injection}=qn_{base}v_{base}$, where $n_{base}$ is the injected electron concentration on the base side of the emitter-base junction and where $v_{base}$ is the electron velocity through the base. The ratio $j_{injection}/j_{interface}=v_{base}n_{base}/v_{interface}n_{emitter}$ represents an upper limit to the current gain of the transistor. The ratio of electron density on either side of the metallurgical junction leads to an effective multiplication of the interface recombination velocity by $\exp(q\Delta E_c/kT)$, directly affecting the current gain.

The second undesirable feature in an HBT having a GaAsSb base and InP emitter is a reduction of the current at which current gain compression occurs. In typical HBT's, a relatively low emitter doping $N_e$ is used to reduce the emitter-base capacitance. For example, the use of a 4–8× $10^{17}$ cm$^{-3}$ emitter doping places a hard upper limit, of $N_e$ exp($-q\Delta E_c/kT$), on the injected electron density in the base. This is illustrated by the energy band diagram 51 in FIG. 2, which represents the InP/GaAsSb/InP HBT of FIG. 1 at a strong forward bias on the emitter-base junction 68. As this bias is approached, the emitter capacitance becomes quite large and the frequency response is rapidly lowered. For purely diffusive transport, the electron velocity through the base, denoted by $v_{base}$, is on the order of $10^7$ cm/sec in a typical microwave transistor. This leads to gain compression, in the presence of the electron discontinuity, at a current density in the range of 20 amperes/square centimeter (A/cm$^2$) to 5×10$^4$ A/cm$^2$. The experimental values are closer to the high end of this range, but still seriously limit the device operation by limiting the emitter charging frequency $g_m/(2\pi C_e)$, where $g_m$ is the dynamic emitter conductance and $C_e$ is the emitter junction capacitance.

These problems can be reduced or eliminated by reducing or eliminating the conduction-band discontinuity by advantageously aligning the energy bands. However, a material system that actually results in such a band lineup, and that meets lattice-matching requirements, is difficult, or perhaps even impossible to produce without resorting to quaternary emitter or base materials. Quaternary materials, such as aluminum-indium-arsenide-phosphide (AlInAsP), are notoriously difficult to grow as high quality films. Lattice matching is problematic and the etch steps in the fabrication processes can also present difficulties. A different approach is to use an emitter material that has slightly higher conduction-band energy than GaAsSb. This approach will result in the formation of a conduction band spike at the emitter-base junction, which will increase the turn-on voltage. However, there will not be any current limiting, and the effect of the spike on the turn-on voltage can be reduced substantially by allowing the electrons to pass through the spike by tunneling, instead of requiring sufficient energy to overcome it. This is known as tunneling through the spike.

Therefore, there is a need in the industry for an HBT having an emitter material with a conduction band energy higher than the conduction band energy in the base, but that is easy to fabricate using existing technologies.

SUMMARY OF THE INVENTION

The invention provides an HBT having a base-emitter junction that exhibits the desirable properties of a GaAsSb/AlInAs interface, and that includes an intermediate layer in the emitter such that the intermediate layer contacts the GaAsSb base and the AlInAs emitter. The intermediate layer is sufficiently thin to be substantially electrically transparent, but sufficiently thick to provide a surface over which to grow the AlInAs emitter. The substantially electrically transparent intermediate layer may either be lattice matched to the GaAsSb base and the AlInAs emitter or be pseudomorphically grown so as to provide an apparent lattice-match to the GaAsSb base and the AlInAs emitter. The lattice in a pseudomorphic layer is stretched or compressed so that it matches the substrate lattice in the two dimensions perpendicular to the growth direction.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

While described below using an npn heterojunction bipolar transistor (HBT), the invention is equally applicable to an HBT having a pnp configuration.

Figure 1:
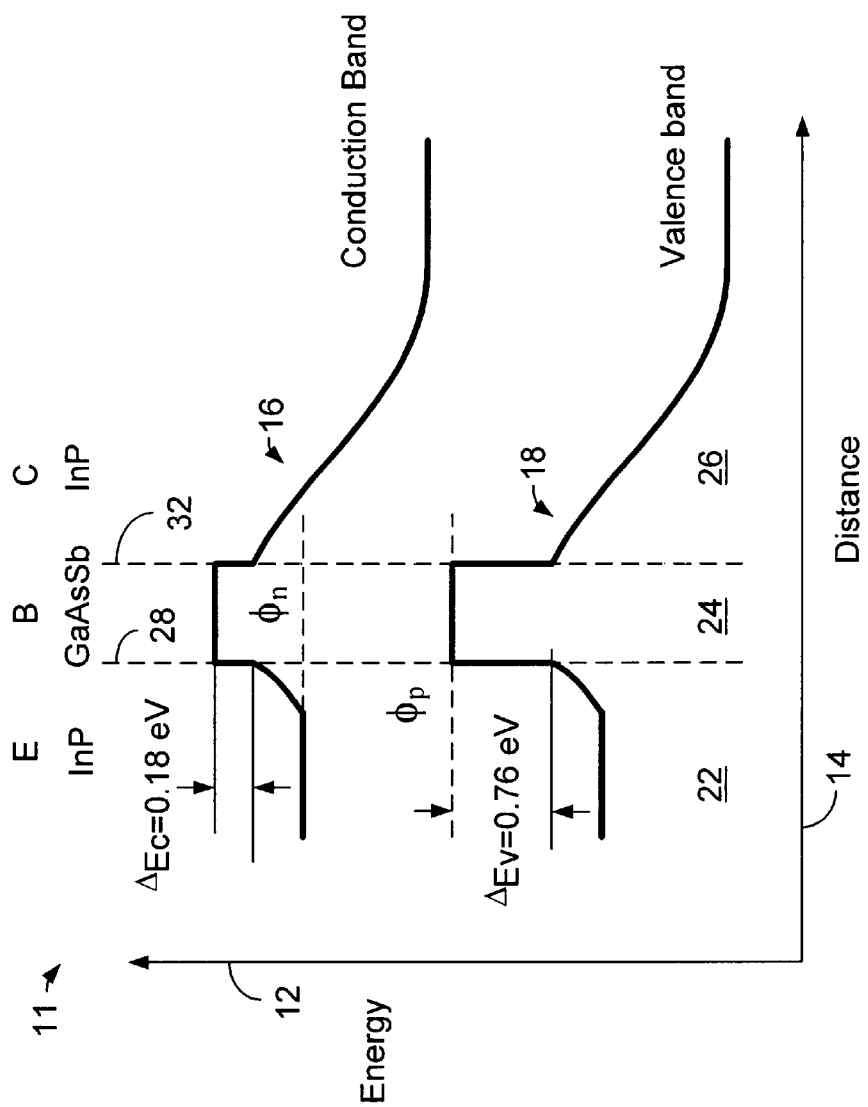
FIG. 1 is a graphical illustration showing an energy band diagram of a conventional InP emitter/GaAsSb base/InP collector HBT under modest forward electrical bias on the emitter-base junction.
Figure 2:
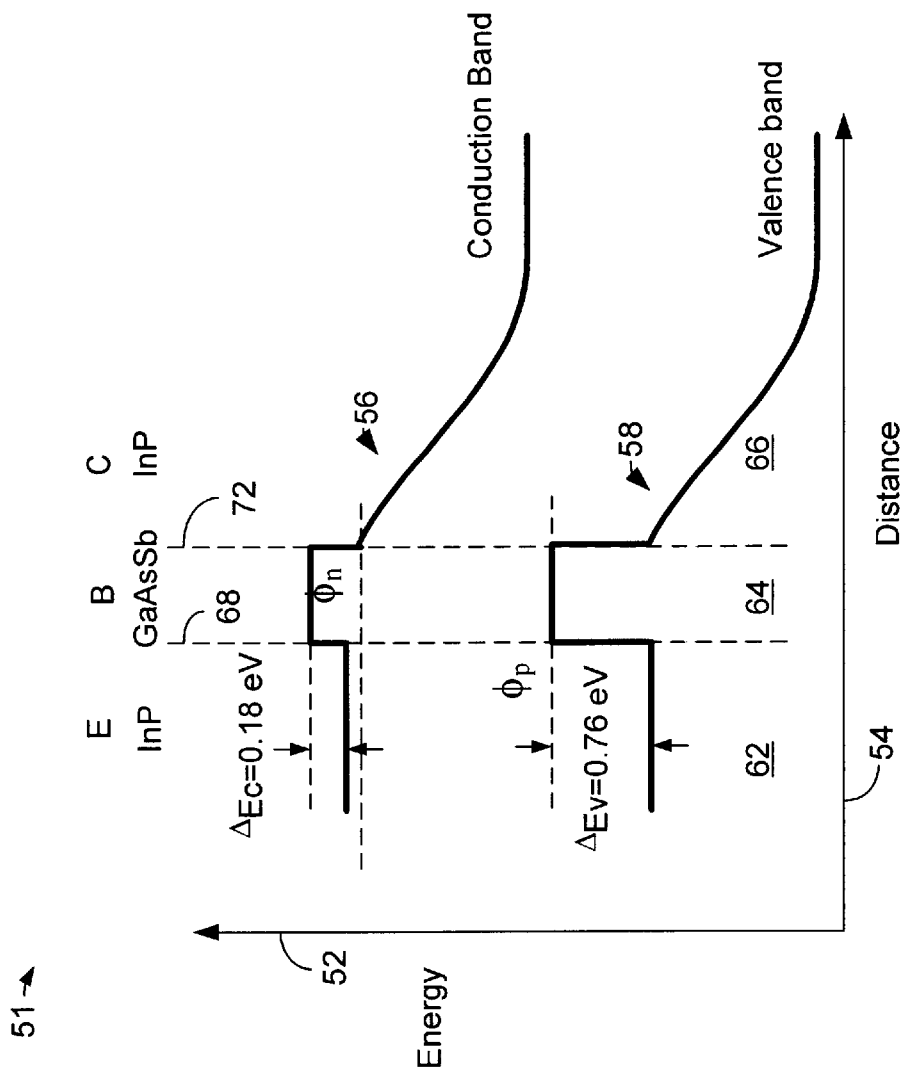
FIG. 2 is a graphical illustration showing an energy band diagram of the InP emitter/GaAsSb base/InP collector HBT of FIG. 1 at a strong forward bias on the emitter-base junction.
Figure 3:
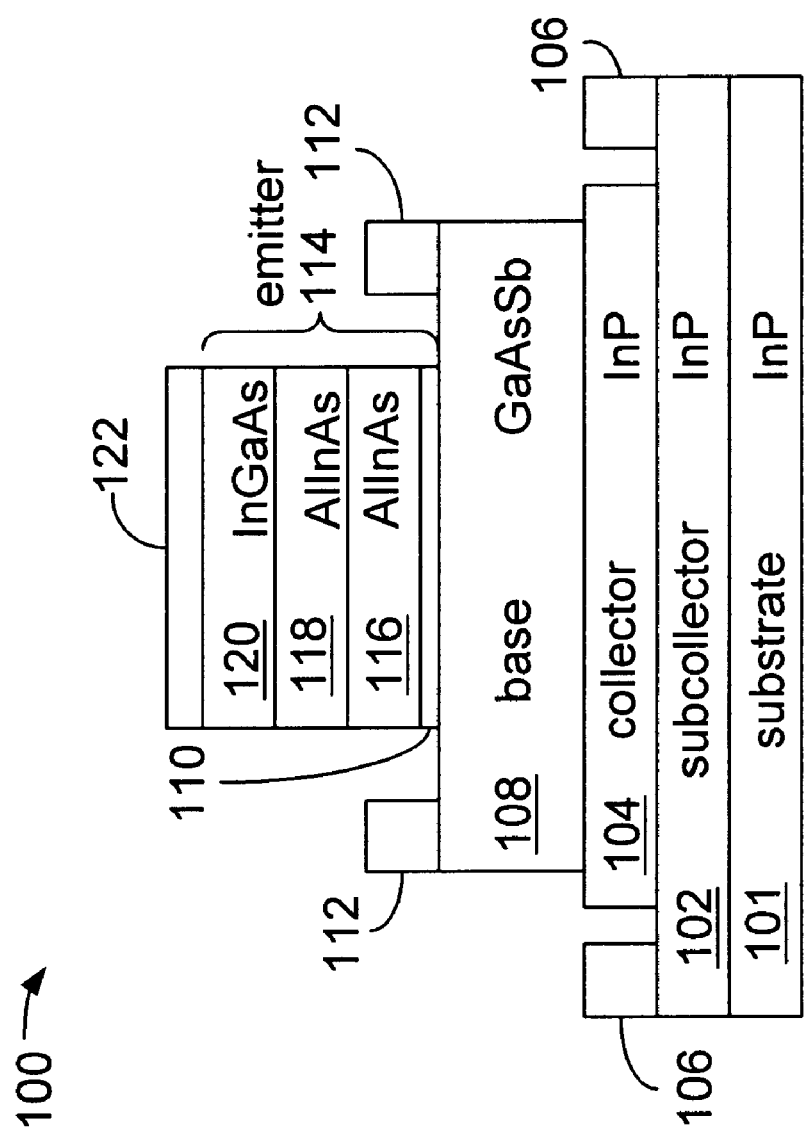
FIG. 3 is a cross-sectional view illustrating an HBT constructed in accordance with the invention.

FIG. 3 is a cross-sectional view illustrating a simplified HBT 100 constructed in accordance with the invention. The HBT 100 includes an InP substrate 101 over which a heavily n-doped subcollector layer 102 is grown. An n-doped InP collector layer 104 is grown over the subcollector layer 102. Metal contacts 106 are applied over portions of the subcollector layer 102 as shown.

A heavily p-doped GaAsSb base layer 108 is grown over the InP collector layer 104 and metal contacts 112 are applied to portions of the base layer 108 as shown. In accordance with an aspect of the invention, an intermediate layer 110 is grown on the base layer 108. The thin intermediate layer 110 forms a narrow quantum well at the emitter-base junction. The intermediate layer 110 has a lattice constant that conforms to the lattice constant of the GaAsSb base layer 108 and the AlInAs emitter 114.

The intermediate layer 110 can be grown lattice-matched to the GaAsSb base layer 108 and the AlInAs emitter 114 using, for example, InP. In such a case, the bulk lattice constant of the intermediate layer 110 matches the lattice constant of the GaAsSb base material and the AlInAs emitter material. Alternatively, the intermediate layer 110 can be made of a non lattice-matched material, but made sufficiently thin and grown pseudomorphically so that its lattice parameter conforms to the lattice parameter of the GaAsSb base layer 108 and the AlInAs emitter 114. For example, were the intermediate layer 110 constructed using In$_x$Ga$_{1-x}$P, where X approaches, but does not equal 1, the intermediate layer 110 would be pseudomorphic and have a lattice constant that conforms to the lattice constant of the GaAsSb base layer 108 and the AlInAs emitter 114.

When a thin intermediate layer is grown pseudomorphically it becomes "strained" so that its lattice constant conforms to the lattice constant of the substrate material. As known to those having ordinary skill in the art, the lattice constant in a pseudomorphic layer is stretched or compressed so that it matches the substrate lattice in the two dimensions perpendicular to the growth direction. Although the lattice parameter in the growth direction will be completely different, the lattice constant presented by the pseudomorphic surface to incoming constituent atoms during growth is the same as a lattice-matched surface. Therefore, physically, the use of a thin pseudomorphic layer as the intermediate layer 110 is very similar to the use of a perfectly lattice-matched intermediate layer 110. For convenience of illustration, the following discussion will assume that the intermediate layer 110 is formed using InP. However, it is possible that other materials having a bulk lattice constant that matches the lattice constant of the GaAsSb base material and the AlInAs emitter material may be used to form the intermediate layer 110. Similarly, pseudomorphically grown intermediate layers other than $In_XGa_{1-X}P$, where X approaches, but does not equal 1 may be used.

The emitter 114 comprises a lightly n-doped AlInAs layer 116 grown over the intermediate layer 110. A heavier n-doped AlInAs layer 118 is grown over the AlInAs layer 116, and a heavily n-doped InGaAs layer 120 is grown over the AlInAs layer 118. These two layers 118 and 120 provide an ohmic contact to the emitter 114 to allow metal contact 122 to be applied over the emitter 114. The subcollector layer 102, collector layer 104, base layer 108, intermediate layer 110 and the emitter 114 can be grown using, for example but not limited to, molecular beam epitaxy (MBE).

As mentioned above, the velocity of interface recombination depends in part on the number of traps, $N_{traps}$, present at the metallurgical emitter-base junction. There is no simple way of predicting, for a given heterojunction, the trap density, but minimizing it is desirable. Thus, the InP/GaAsSb heterojunction formed by the GaAsSb base layer 108 and the intermediate layer 110 appears to have an acceptably low density of traps since HBT's with good gain can be grown in this material system. This is difficult to achieve with an AlInAs/GaAsSb junction. Therefore, the structure formed using an intermediate layer 110 of InP behaves as if it has the desirable band lineup of the AlInAs/GaAsSb emitter-base structure, while exhibiting the low density of traps characteristic of the InP/GaAsSb emitter-base structure. This is accomplished by exploiting the quantum nature, and light effective mass, of the conduction electrons in most type III–V compounds, and in InP in particular, and the localized nature of interface traps. The result is a structure that can be grown easily and that has the desirable electron transport features of the AlInAs/GaAsSb/InP HBT with current gain equal to or better than the InP/GaAsSb/InP HBT.

Figure 4:
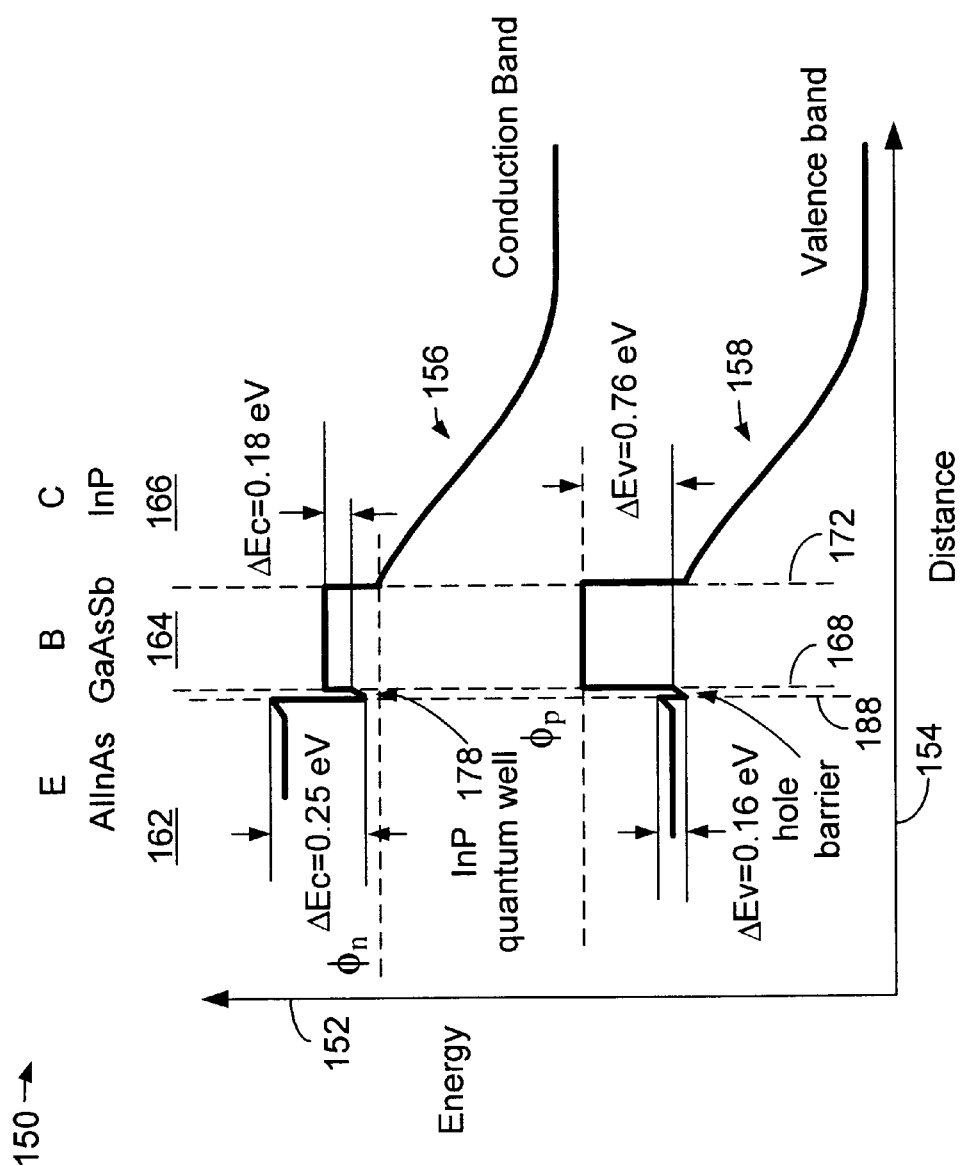
FIG. 4 is a graphical illustration showing an energy band diagram of the HBT of FIG. 3.

FIG. 4 is a graphical illustration showing an energy band diagram 150 of the HBT of FIG. 3. The InP quantum well 178 forms two heterojunctions between the AlInAs emitter region 162 and the GaAsSb base region 164. One heterojunction is formed at the InP/GaAsSb interface 168 and one heterojunction is formed at the InP/AlInAs interface 188. The InP quantum well 178 forms an effective heterojunction between the GaAsSb base region 164 and AlInAs emitter region 162 with energy discontinuities of 0.07 eV ($\Delta E_c$= 0.25−0.18) in the conduction band and 0.60 eV ($\Delta E_v$=0.76−0.16) in the valence band. The location of this effective heterojunction is at the InP/GaAsSb interface 168 in the valence band, but is at the AlInAs/InP interface 188 in the conduction band. The heterojunction formed at the GaAsSb/InP interface 172 between the GaAsSb base region 164 and the InP collector region 166 provides a conduction band discontinuity $\Delta E_c$ of 0.18 eV and a valence band discontinuity $\Delta E_v$ of 0.76 eV.

As mentioned above, the desirable properties for an AlInAs/GaAsSb HBT stem from the band lineup of these materials. As a general rule, band lineup is thought to be independent of any interposed layers. Thus, the placement of the InP intermediate layer 110 between the GaAsSb base layer 108 and the AlInAs emitter 114 should not materially affect the band lineup between the AlInAs emitter region 162 and the GaAsSb base region 164. However, as illustrated in FIG. 4, the InP intermediate layer 110 creates an InP quantum well 178 at the metallurgical junction between the AlInAs emitter region 162 and the GaAsSb region 164. If electrons are captured in this well, they will tend to contribute to the undesirable emitter recombination current. However, in accordance with an aspect of the invention, by taking into account the quantum mechanical properties of the electron, the InP quantum well 178 can be designed to have virtually no effect on the electron density. In effect, the InP quantum well 178 can be designed to be electrically transparent, as will be described below.

Figure 5:
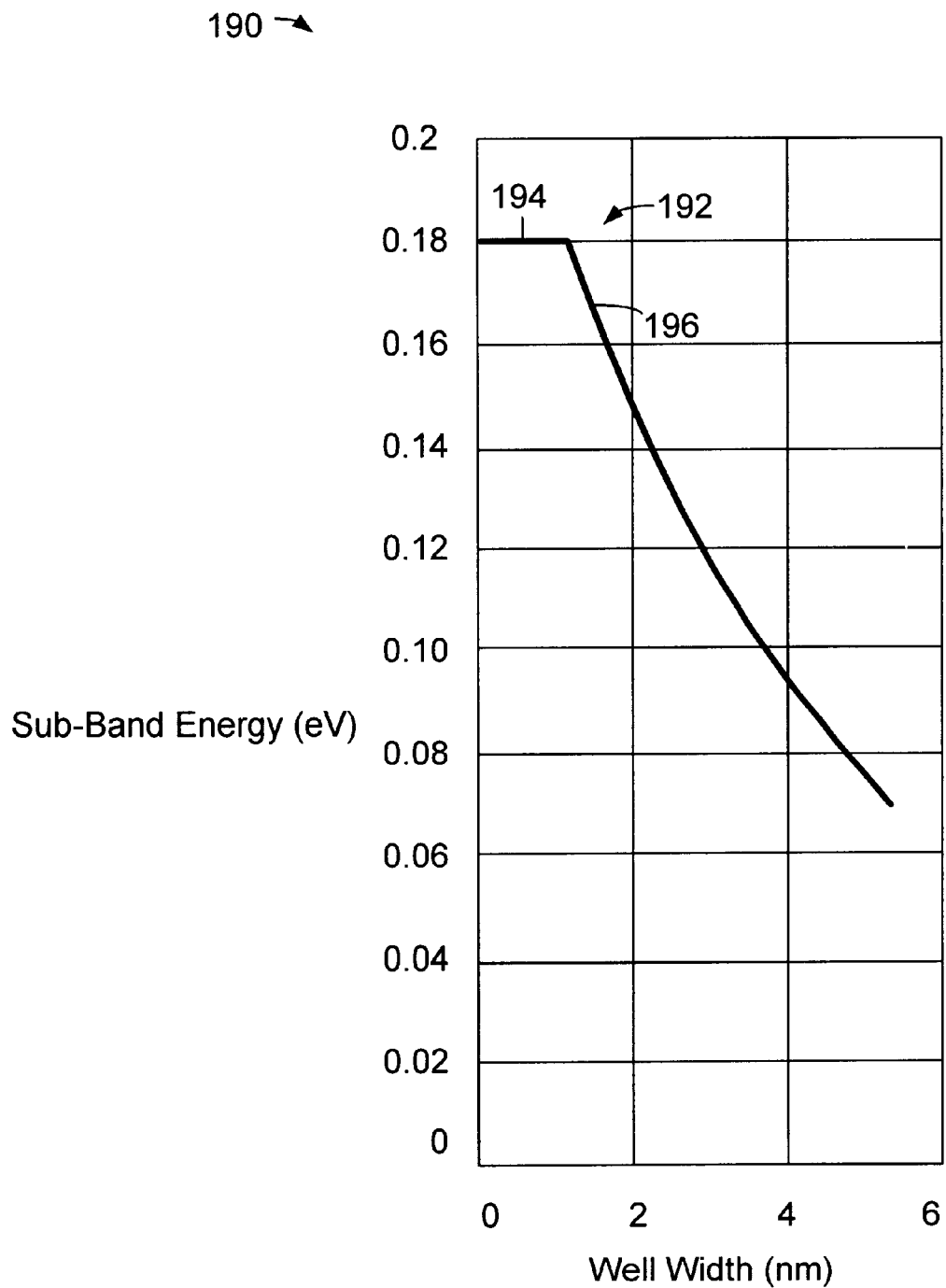
FIG. 5 is a graphical illustration of the sub-band energy of an InP quantum well.

FIG. 5 is a graphical illustration 190 of the sub-band energy of an InP quantum well. The vertical axis represents sub-band energy in eV and the horizontal axis represents the width of the quantum well in nm. The trace 192 illustrates the calculated eigenenergy of the lowest energy state in an asymmetric square-well potential, with a 0.18 eV barrier on one side and a 0.25 eV barrier on the other. The electron is assumed to have an effective mass of 0.077 $m_o$, where $m_o$ is the free electron mass. These values are appropriate for an InP quantum well confined between lattice-matched AlInAs and GaAsSb as illustrated with respect to FIGS. 3 and 4.

For illustration purposes, the energy in FIG. 5 is referred to as the "lowest sub-band energy" and is representative of a one-dimensional (1D) calculation. However, the real world is three-dimensional (3D). Therefore, the illustrated 1D quantum well may confine the electron in 1 dimension but leave it free to move in the other 2. The energy in FIG. 5 is referred to as the "lowest sub-band energy" $E_{sb}$ because we are explicitly describing a 1D quantum well in 3D reality. This energy is the same as the 1D eigenenergy.

For quantum wells thinner than about 2 nm, as illustrated using portion 196 of trace 192, the energy of the lowest state is so close to the band energy of the GaAsSb base that thermal smearing of the electron energy will render any excess in the electron population negligibly small. A quantum well that confines the electrons in the direction perpendicular to the interface, and leaves them free in the other 2 dimensions with a single sub-band has a constant density of states $N_{ss}$ of about $3.2\times10^{13}$ cm$^{-2}$ eV$^{-1}$ for an effective mass of 0.077 $m_o$. The injected area electron density:

$$n_{base-sheet} = W_{base} N_c \exp(-q(E_c - E_f)/kT))$$

can be compared to the density per unit area of electrons bound in the quantum well:

$$n_{ss} = (kT/q) N_{ss} \exp(-q(E_c-E_f)/kT) \exp(q((E_c-E_{sb})/kT)(1-\exp(-q(E_c-E_{sb})/kT), \text{ or}$$

$$n_{ss}/n_{base-sheet} \approx (E_c - E_{sb}) N_{ss} \exp(q(E_c - E_{sb})/kT)/W_{base} N_c$$

so, for a bound state kT/q below the conduction-band energy, $n_{ss}$ is of the same order as the injected sheet electron concentration in the base, and will increase the band-to-band and interface recombination by a tolerable amount.

Further, as illustrated by the portion 194 of trace 192, for quantum wells thinner than approximately 1.1 nm, there is no bound state associated with the well. This is a consequence of the asymmetry of the barriers and indicates that, for thin intermediate layers, even at zero temperature, there is no excess concentration of electrons in the InP, and hence no undesirable effect on the emitter recombination current. Essentially, for thin intermediate layers between the emitter region 162 and the base region 164 (FIG. 4) the intermediate layer is electrically transparent in that it has no effect on the electron density and it does not present any barrier to electron transport. In this manner, a thin InP intermediate layer between the AlInAs emitter and the GaAsSb base provides a lattice matched surface to both the AlInAs emitter and the GaAsSb base and also allows the HBT to retain the superior performance accorded by the use of the AlInAs emitter. The lattice match between the GaAsSb base and the InP quantum well and the lattice match between the InP quantum well and the AlInAs emitter can be achieved either through direct lattice match, or by pseudomorphically growing a thin layer of a non lattice-matched material as the intermediate layer.

Referring back to FIG. 3, inserting an InP intermediate layer 110 between the emitter 114 and the base layer 108 has little or no harmful effect on the gain, but there is also an additional, positive, attribute. The AlInAs/GaAsSb interface is replaced with AlInAs/InP and InP/GaAsSb interfaces. As mentioned above, the use of an AlInAs emitter, or any emitter having a conduction band energy larger than or equal to the conduction band energy in the base eliminates spatially indirect band-to-band recombination. This remains true for the emitter with a thin InP intermediate layer since, as discussed above, there is no bound state for such a thin InP layer. The remaining mechanism for interface recombination is through interface traps, and the problem becomes that of controlling the recombination velocity $v_{interface} = \sigma_n v_{thermal} N_{traps}$. For the AlInAs emitter 114, it is evident that only the area concentration $N_{traps}$ and the cross-section of those traps for electron capture is of a consequence. These will be determined by the physical chemistry of the AlInAs/GaAsSb interface.

Referring back to FIG. 4, there are now two interfaces close to the emitter-base junction: the AlInAs/InP interface 188 and the InP/GaAsSb interface 168. Note that while the holes in the base approach the InP/GaAsSb interface 168, they can only reach the AlInAs/InP interface 188 by tunneling through the 0.76 eV barrier presented by the InP intermediate layer 110 (FIG. 3). The potential of both the AlInAs/InP interface 188 and the InP/GaAsSb interface 168 to contribute to interface recombination should be considered. Consider first whether there is an ample supply of holes since recombination takes place by alternating between trapping electrons and trapping holes. Here, it is possible to nearly rule out the AlInAs/InP interface 188 contributing to interface recombination because holes cannot directly flow to the AlInAs/InP interface 188; they can only reach it by tunneling through the 0.76 eV barrier presented by the InP. The tunneling probability differs substantially between light and heavy holes, and depends on the barrier width, but can reduce the effect of the heterojunction formed at the AlInAs/InP interface 188 by more than an order of magnitude.

Thus, it is believed that the key interface for determining the interface recombination velocity is the InP/GaAsSb interface 168. The heterojunction formed at this interface 168 can be grown with good properties and experimental results support the superiority of the InP/GaAsSb interface over the AlInAs/GaAsSb interface. Further, the combination of the AlInAs/InP and InP/GaAsSb interfaces exhibits better current gain than the AlInAs/GaAsSb interface alone.

Figure 6:
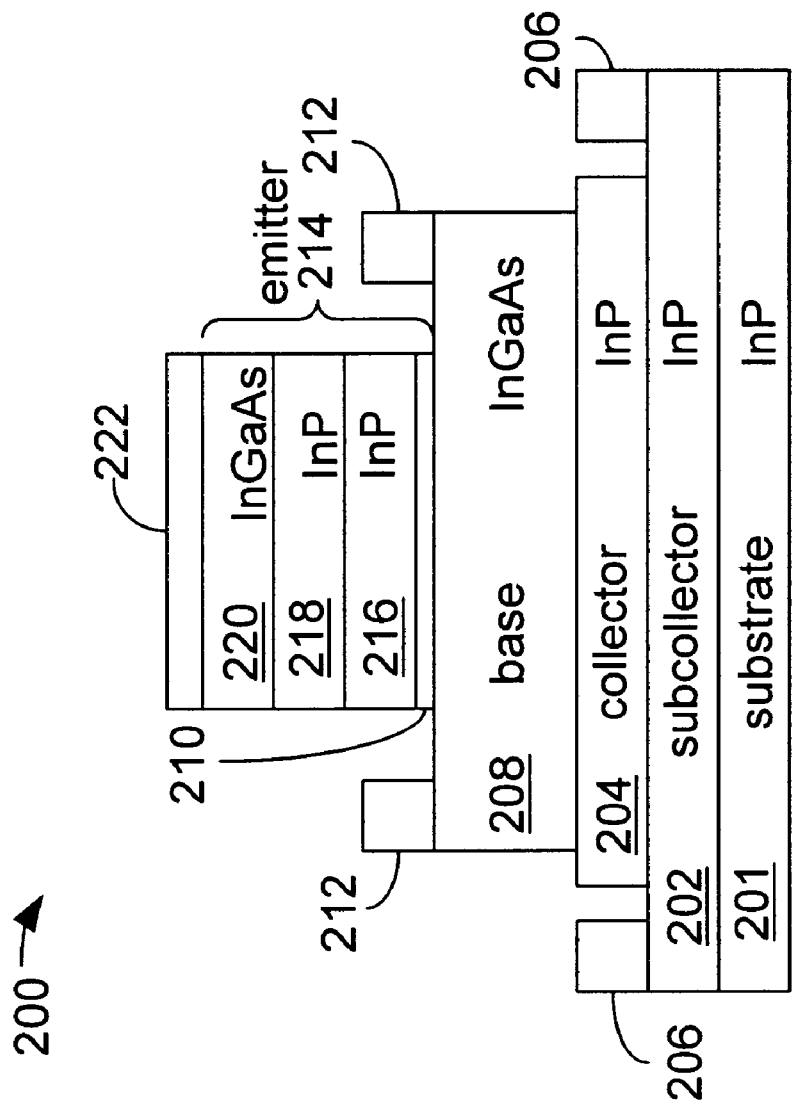
FIG. 6 is a cross-sectional view illustrating an alternative embodiment of the HBT of FIG. 3.

FIG. 6 is a cross-sectional view illustrating an alternative embodiment of the HBT 100 of FIG. 3. The HBT 200 includes an InP substrate 201 over which a heavily n-doped subcollector layer 202 is grown. An n-doped InP collector layer 204 is grown over the subcollector layer 202. Metal contacts 206 are applied over portions of the subcollector layer 202 as shown.

In a departure from that described above with respect to FIG. 3, a p-doped InGaAs base layer 208 is grown over the InP collector layer 204 and metal contacts 212 are applied to portions of the base layer 208 as shown. In accordance with this aspect of the invention, an intermediate layer 210 of GaAsSb is grown on the InGaAs base layer 208. As will be described below with respect to FIG. 7, the thin GaAsSb intermediate layer 210 forms a narrow quantum well at the emitter-base junction, but in this embodiment, the quantum well is formed in the valence band instead of in the conduction band. The intermediate layer 210 of GaAsSb has a lattice constant that conforms to the lattice constant of the InGaAs base layer 208 and the InP emitter 214. The intermediate layer 210 can be grown lattice-matched to the InGaAs base layer 208 and the InP emitter 214 by using a material such as GaAsSb. Alternatively, the intermediate layer 210 can be made of a non lattice-matched material, but made sufficiently thin and grown pseudomorphically so that its lattice parameter conforms to the lattice parameter of the InGaAs base layer 208 and the InP emitter 214. As mentioned above, such a thin intermediate layer can be grown pseudomorphically and "strained" so that it conforms to the substrate material's lattice constant.

The emitter 214 comprises a lightly n-doped InP layer 216 grown over the intermediate layer 210 comprising GaAsSb. A heavier n-doped InP layer 218 is grown over the InP layer 216, and a heavily n-doped InGaAs layer 220 is grown over the InP layer 218. These two layers 218 and 220 provide an ohmic contact to the emitter 214 to allow metal contact 222 to be applied over the emitter 214. The subcollector layer 202, collector layer 204, base layer 208, intermediate layer 210 and the emitter 214 can be grown using, for example but not limited to, molecular beam epitaxy (MBE).

Figure 7:
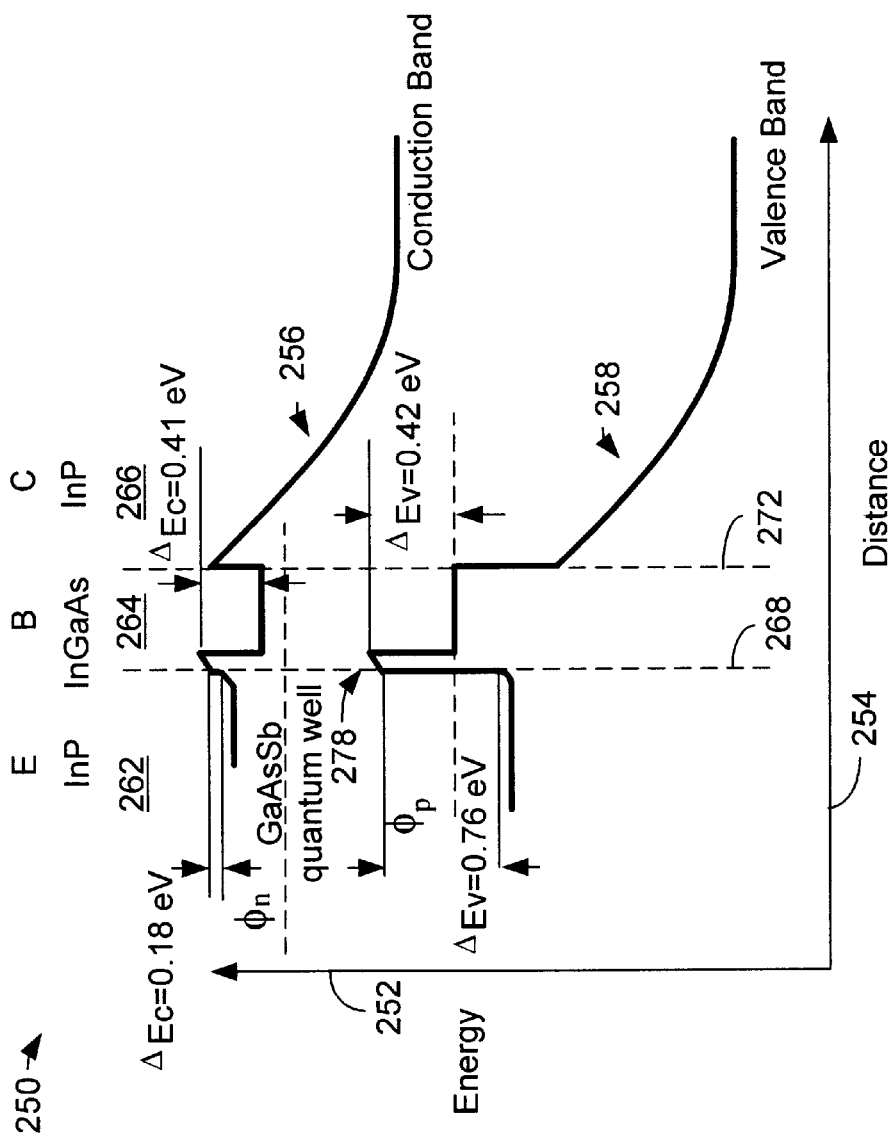
FIG. 7 is a graphical illustration showing an energy band diagram of the HBT of FIG. 6.

FIG. 7 is a graphical illustration showing an energy band diagram 250 of the HBT of FIG. 6. The GaAsSb quantum well 278 forms two heterojunctions between the InP emitter region 262 and the InGaAs base region 264. One heterojunction is formed at the InP/GaAsSb interface 268 and one heterojunction is formed at the GaAsSb/InGaAs interface 288. The GaAsSb quantum well 278 forms an effective heterojunction between the InGaAs base region 264 and InP emitter region 262 with energy discontinuities of 0.23 eV ($\Delta E_c = 0.41 - 0.18$) in the conduction band and 0.34 eV ($\Delta E_v = 0.76 - 0.42$) in the valence band. The location of this effective heterojunction is at the InP/GaAsSb interface 268 in the valence band, but is at the GaAsSb/InGaAs interface 288 in the conduction band. As shown, an asymmetrical quantum well 278 is formed in the valence band at the emitter-base junction as a result of the GaAsSb intermediate layer 210 formed between the InP emitter 214 and the InGaAs base layer 208 of FIG. 6.

Although described with particular reference to an HBT having an InP collector, an AlInAs emitter and a GaAsSb base between which an intermediate layer of InP is grown, and an HBT having an InP collector, an InP emitter and an InGaAs base between which an intermediate layer of GaAsSb is grown, the invention could be described as a structure that maintains a desirable band lineup (in this case the type I lineup between AlInAs and GaAsSb) while maintaining the desirable physical chemistry of interfaces with a different band lineup (in this case comprising InP/GaAsSb and InP/AlInAs). This is accomplished by exploiting the quantum-mechanical properties of thin potential wells.

It will be apparent to those skilled in the art that many modifications and variations may be made to the preferred embodiments of the present invention, as set forth above, without departing substantially from the principles of the present invention. For example, both npn and pnp HBTs can benefit from the concepts of the invention. All such modifications and variations are intended to be included herein within the scope of the present invention, as defined in the claims that follow.

What is claimed is:

1. A heterojunction bipolar transistor (HBT), comprising:
   a collector;
   a base located over the collector; and
   an emitter located over the base, the emitter including an intermediate layer in contact with the base, the intermediate layer being substantially electrically transparent with respect to the base and the emitter, and where the intermediate layer has a lattice constant that conforms to the lattice constant of the base and the emitter.

2. The HBT of claim 1, wherein the collector is indium-phosphide (InP), the base is gallium-arsenide-antimonide (GaAsSb) and the emitter includes an intermediate layer of InP and a layer of aluminum-indium-arsenide (AlInAs).

3. The HBT of claim 2, where the intermediate layer of InP is thinner than 2 nanometers (nm).

4. The HBT of claim 2, where the intermediate layer of InP is thinner than 1.2 nanometers (nm).

5. The HBT of claim 1, where the HBT is configured as an npn transistor.

6. The HBT of claim 1, where the base has a bandgap smaller than the bandgap of the emitter.

7. The HBT of claim 1, wherein the collector is indium-phosphide (InP), the base is indium-gallium-arsenide (InGaAs) and the emitter includes an intermediate layer of gallium-arsenide-antimonide (GaAsSb) and a layer of InP.

8. The HBT of claim 1, wherein the intermediate layer is pseudomorphically grown.

9. The HBT of claim 1, wherein the material of the intermediate layer has a bulk lattice constant that matches the lattice constant of the material of the base and the material of the emitter.

10. The HBT of claim 1, wherein the base and the emitter are of materials that provide good electrical properties and the intermediate layer allows the emitter to be grown over the base.

11. A method for making a heterojunction bipolar transistor (HBT), the method comprising the steps of:
    forming a collector;
    forming a base over the collector; and
    forming an emitter over the base, the emitter including an intermediate layer in contact with the base, the intermediate layer being substantially electrically transparent with respect to the base and the emitter, and where the intermediate layer has a lattice constant that conforms to the lattice constant of the base and the emitter.

12. The method of claim 11, wherein the collector is formed using indium-phosphide (InP), the base is formed using gallium-arsenide-antimonide (GaAsSb), and the emitter is formed using an intermediate layer of InP and a layer of aluminum-indium-arsenide (AlInAs).

13. The method of claim 12, where the intermediate layer of InP is thinner than 2 nanometers (nm).

14. The method of claim 12, where the intermediate layer of InP is thinner than 1.1 nanometers (nm).

15. The method of claim 11, wherein the collector is formed using indium-phosphide (InP), the base is formed using indium-gallium-arsenide (InGaAs), and the emitter is formed using an intermediate layer of gallium-arsenide-antimonide (GaAsSb) and a layer of InP.

16. The method of claim 11, wherein the intermediate layer is pseudomorphically grown.

17. The method of claim 11, wherein the material of the intermediate layer has a bulk lattice constant that matches the lattice constant of the material of the base and the material of the emitter.

18. The method of claim 11, wherein the base and the emitter are of materials that provide good electrical properties and the intermediate layer allows the emitter to be grown over the base.

19. A heterojunction bipolar transistor (HBT), comprising:
    a collector constructed using indium-phosphide (InP);
    a base located over the collector and constructed using gallium-arsenide-antimonide (GaAsSb); and
    an emitter located over the base and constructed using a plurality of layers, where a first layer includes an intermediate layer of InP in contact with the base, the intermediate layer being substantially electrically transparent, and where a second layer includes aluminum-indium-arsenide (AlInAs), and where the intermediate layer has a lattice constant that conforms to the lattice constant of the base and the second layer of the emitter.

20. The HBT of claim 19, where the intermediate layer of InP is thinner than 2 nanometers (nm).

21. The HBT of claim 19, where the intermediate layer of InP is thinner than 1.2 nanometers (nm).

22. The HBT of claim 19, where the HBT is configured as an npn transistor.

23. The HBT of claim 19, wherein the intermediate layer is pseudomorphically grown.

24. The HBT of claim 19, wherein the intermediate layer has a bulk lattice constant that matches the lattice constant of the base and the second layer of the emitter.

* * * * *